(12) United States Patent
Sorg et al.

(10) Patent No.: US 6,897,599 B2
(45) Date of Patent: May 24, 2005

(54) SYSTEM FOR DAMPING OSCILLATIONS

(75) Inventors: Franz Sorg, Aalen (DE); Stefan Xalter, Oberkochen (DE); Frank Melzer, Utzmemmingen (DE); Bernhard Gellrich, Aalen (DE); Michael Muehlbeyer, Aalen (DE)

(73) Assignee: Carl Zeiss SMT AG (DE)

( * ) Notice: Subject to any disclaimer, the term of this patent is extended or adjusted under 35 U.S.C. 154(b) by 94 days.

(21) Appl. No.: 10/075,797

(22) Filed: Feb. 12, 2002

(65) Prior Publication Data

US 2002/0109437 A1 Aug. 15, 2002

(30) Foreign Application Priority Data

Feb. 13, 2001 (DE) .......................... 101 06 605

(51) Int. Cl.[7] .............................................. H01L 41/08
(52) U.S. Cl. .................. 310/326; 310/316.01; 310/321; 310/322
(58) Field of Search ........................... 310/316.01, 331, 310/322, 376, 311

(56) References Cited

U.S. PATENT DOCUMENTS

| | | | |
|---|---|---|---|
| 4,083,433 A | * | 4/1978 | Geohegan et al. .......... 188/382 |
| 4,202,605 A | | 5/1980 | Heinz ......................... 350/292 |
| 4,295,710 A | | 10/1981 | Heinz ......................... 350/310 |
| 4,849,668 A | * | 7/1989 | Crawley et al. ............ 310/328 |
| 5,026,977 A | | 6/1991 | Hubbard, Jr. |
| 5,428,482 A | | 6/1995 | Bruning et al. |
| 5,485,053 A | * | 1/1996 | Baz ............................ 310/326 |
| 5,719,846 A | | 2/1998 | Matoba et al. |
| 5,724,017 A | * | 3/1998 | Pla et al. .................... 336/100 |
| 5,986,795 A | | 11/1999 | Chapman et al. |
| 6,108,121 A | | 8/2000 | Mansell et al. |
| 6,252,334 B1 | * | 6/2001 | Nye et al. ................... 310/328 |
| 6,296,811 B1 | * | 10/2001 | Sasaki ........................ 422/100 |
| 6,405,533 B1 | * | 6/2002 | Rastegar et al. ............. 60/545 |
| 6,411,426 B1 | | 6/2002 | Meehan et al. |
| 6,496,466 B1 | | 12/2002 | Lee et al. |
| 6,566,627 B2 | | 5/2003 | Brandinger et al. |
| 6,585,379 B2 | | 7/2003 | Yokoyama et al. |
| 6,633,107 B1 | * | 10/2003 | Calabro' et al. ............ 310/321 |

FOREIGN PATENT DOCUMENTS

| | | |
|---|---|---|
| CH | 371906 | 10/1963 |
| DE | 3406907 A1 | 10/1984 |
| DE | 198 25 716 A1 | 12/1999 |
| DE | 199 10 947 A1 | 9/2000 |
| EP | 0 053 463 | 6/1982 |
| EP | 0 230 277 A2 | 7/1987 |
| EP | 0 964 281 A1 | 12/1999 |
| EP | 1 209 500 A2 | 5/2002 |
| WO | WO 97/09642 | 9/1997 |
| WO | WO 97/34171 | 9/1997 |

* cited by examiner

*Primary Examiner*—Mark Budd
(74) *Attorney, Agent, or Firm*—Wells St. John P.S.

(57) ABSTRACT

In a system for overcoming or at least damping oscillations in or through channels (9) which carry fluid in a component, in particular coolant in cooling channels in an optical element (1), in particular a projection objective lens (1a) for semiconductor lithography, oscillations which occur are detected and evaluated by sensors (5), after which the result is passed, in the form of an adaptronic control loop to piezoelectric elements (9), which are integrated in the optical element, and are in the form of thin plates, films or layers which, when activated, produce the oscillations or frequencies which counteract oscillations and natural frequencies produced by the turbulence.

31 Claims, 1 Drawing Sheet

SYSTEM FOR DAMPING OSCILLATIONS

RELATED APPLICATIONS

This application relates to and claims priority to corresponding German Patent Application No. 101 06 605.8 filed on Feb. 13, 2001.

BACKGROUND OF THE INVENTION

1. Field of the Invention

The invention relates to a system for damping oscillations in channels which carry fluid in a component, in particular coolant in cooling channels for an optical element, in particular in a projection exposure objective for semiconductor lithography.

2. Description of the Related Art

Optical elements frequently need to be cooled owing to the radiation energy, in particular in semiconductor lithography using lasers which emit beams in the UV band. This applies, for example, to mirrors in EUV systems, which are provided, in their housing, with cooling channels through which a cooling liquid flows. This results in the heat being dissipated. However, one problem is that the flowing medium can lead to oscillations and natural frequencies resulting from possible turbulence, for example in the region of channel direction changes, which have a highly disadvantageous effect on the optical function of the entire optical system.

SUMMARY OF THE INVENTION

The present invention is thus based on the object of achieving a system for overcoming or at least damping oscillations in or through channels which carry fluid, in such a manner that the flowing medium does not cause any negative effects.

According to the invention, this object is achieved by the following steps:

a) oscillations that occur being detected by sensors,
b) after the detection the results are supplied in the form of a control loop to actuators,
c) the actuators are piezoelectric elements in the form of thin plates, films or layers and
d) by activation of said actuators oscillations are produced, which arc in antiphase to the oscillations produced by turbulence in the fluid, and whose frequency and amplitude are at least approximately the same.

According to the invention, piezoelectric actuators in the form of thin plates, films or layers can now be used in conjunction with a control loop, for example an adaptronic control loop, in which sensors detect the oscillations, and the oscillators are signaled via a computation unit for evaluation to the piezoelectric actuators, so that the latter are activated appropriately and can produce oscillations and frequencies which counteract oscillations and natural frequencies produced by turbulence.

According to the invention, both the piezoelectric actuators and the sensors are integrated in the component, for this purpose.

In principle, the most widely differing types of sensors can be used for detection of the oscillations that occur. In one very advantageous embodiment of the invention, however, piezoelectric sensors are likewise used for this purpose, and are advantageously arranged alternately in the region of the turbulence zones, for example channel direction changes.

Although, in principle, the use of piezoelectric elements, such as piezo stacks, in optics is already known from U.S. Pat. No. 4,202,605 and U.S. Pat. No. 4,295,710, in which piezo stacks are used for setting facetted mirrors, for use in the form of plates, films or layers in an adaptronic control loop with sensors and actuators is, however, novel, and represents a solution that is not obvious.

An exemplary embodiment of the invention is described in principle in the following text, with reference to the drawing.

DETAILED DESCRIPTION

The invention will be described in the following text with reference to a mirror in an EUV system with a projection exposure objective for semiconductor lithography. However, of course, the invention can also be applied to other fields of optics, and can also be used in other areas.

Figure 1:
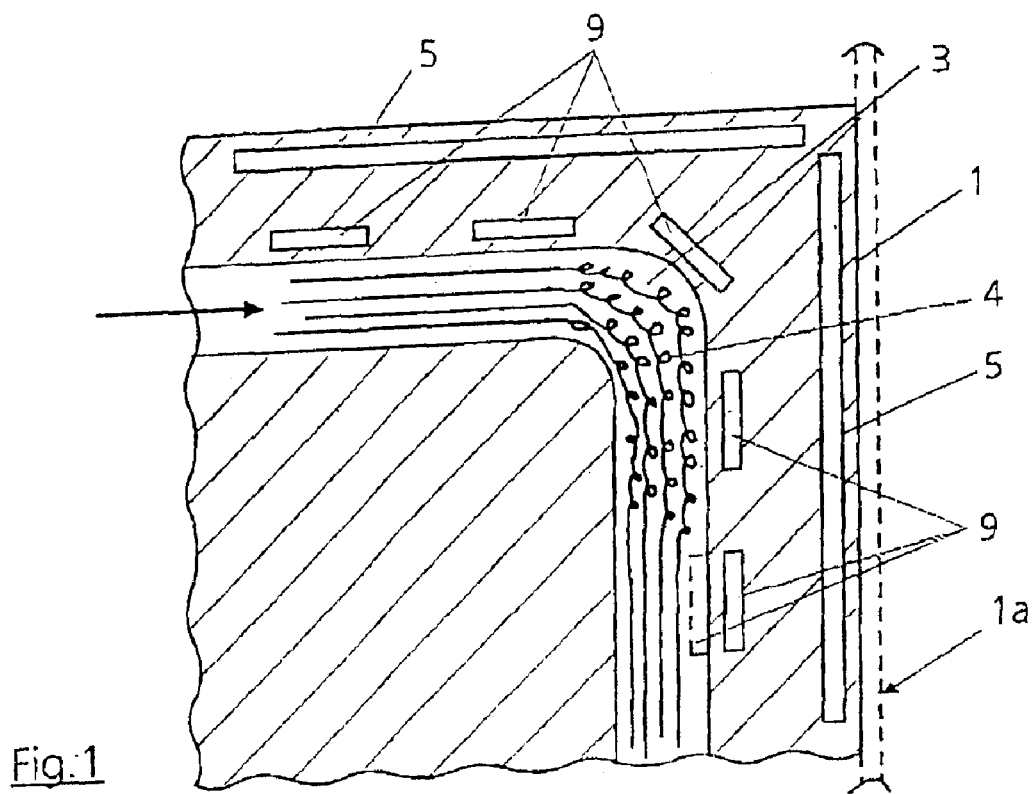
FIG. 1 shows a detail of a mirror with a cooling channel in the corner region.

The EUV radiation from a beam source causes heating in the mirror. For this reason, it is known for the mirror 1, which is arranged, for example, in a projection exposure objective 1a (indicated only by dashed lines) to be provided with cooling channels 2, in which a cooling medium circulates. Even if attempts are made to force the cooling medium to circulate with a laminar flow, it is not always possible to avoid turbulence occurring. This is particularly true in the region of channel direction chances 3. FIG. 1 shows a laminar flow on the input side, and a turbulent flow 4 in the area of a direction change, which may once again be followed by a laminar flow. The turbulent flow 4 causes the mirror 1 to oscillate, resulting in changes to the optical path length, which can lead to corresponding imaging errors. This means that, in order to avoid such imaging errors, it is necessary to avoid the oscillations that occur, or at least to considerably counteract them. This is done by using counter measures in those areas in which the greatest deformations caused by oscillations occur.

Figure 2:
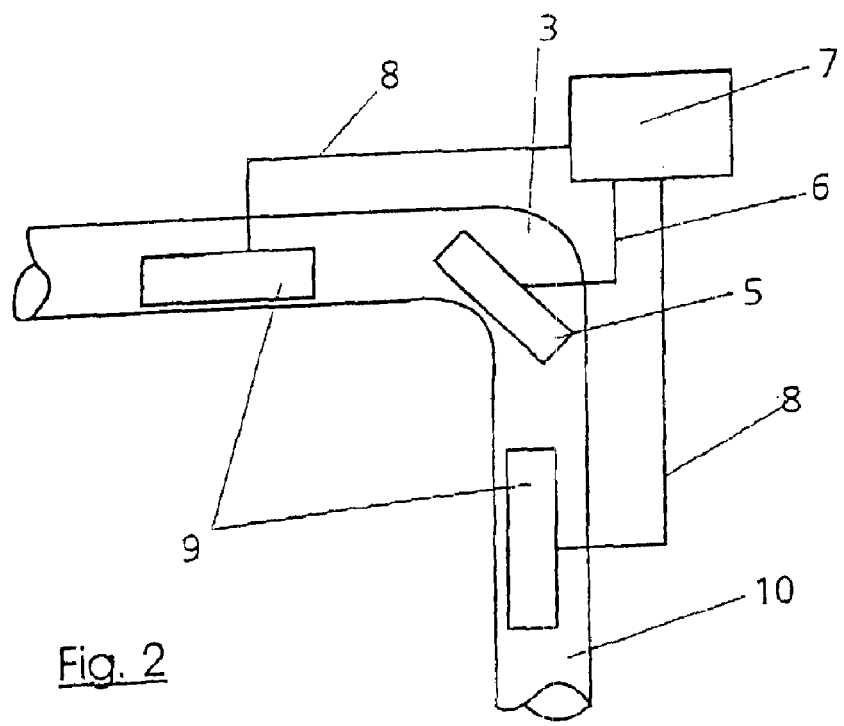
FIG. 2 shows a detail of a cooling loop or a cooling tube.

To this end, it is necessary to detect the oscillations, in a first step. This is done using sensors in the form of piezoelectric elements 5, which are arranged or integrated in the mirror 1 in the region of the direction change 3. The oscillations lead to the production of electrical voltages in the piezoelectric elements, owing to the length changes, and these electrical voltages are passed via control lines 6 (only one is illustrated in FIG. 2, by way of example) to a computation and evaluation unit 7. Depending on the magnitude and form of the oscillations, voltage pulses are passed to actuators 9, in the form of piezoelectric elements, via control lines 8 from the computation and evaluation units 7. The application of the voltages leads to length changes in the piezoelectric elements that are used as actuators 9. The essential feature is now that the pulses introduced via the control line 8 stimulate the piezoelectric elements 9 such that "opposing oscillations" occur, whose magnitude and form, i.e. whose frequency and amplitude compensate for, or at least considerably damp, the oscillations occurring due to the turbulent flow.

The piezoelectric elements can be arranged alternately as sensors 5 and as actuators 9 in the mirror 1.

The arrangement of the piezoelectric elements 5 and 9 is governed by the physical characteristics. Thus, for example, they can be arranged on the outside of the cooling channels 2 in the mirror 1, or else in the cooling channel 2 itself, as is indicated, for example, in the form of a dashed line by 9' in FIG. 1. The piezoelectric elements 5 and 9 can likewise also be bonded directly onto the outside or inside of a cooling loop 10.

The piezoelectric elements are fitted or introduced into the structure or mirror 1 in the form of very thin-walled plates, films or layers.

It is also possible to provide for all the piezoelectric elements 5, 9 to be configured as sensors 5 in the quiescent state or in a phase with only minor oscillation excitation. In this way, all the elements detect disturbances, after which, by means of an appropriate control system, only individual, specific piezoelectric elements or, if necessary, even all the piezoelectric elements, are then activated as actuators 9. The advantage of this configuration is that there is then no need to assign specific piezoelectric elements as sensors or as actuators.

What is claimed is:

1. A system for damping oscillations in cooling channels of an optical element through which fluid flows in a component with the following steps:
    a) oscillations that occur being detected by sensors,
    b) after the detection the results are supplied in the form of a control loop to actuators,
    c) the actuators are piezoelectric elements in the form of thin plates, films or layers,
    d) by activation of said actuators oscillations are produced, which are in antiphase to the oscillations produced by turbulence in the fluid, and whose frequency and amplitude are at least approximately the same,
    wherein said sensors are piezoelectric elements, and
    wherein said piezoelectric elements are arranged alternately as sensors and as actuators in the component.

2. The system as claimed in claim 1, wherein said actuators and said sensors are arranged in an region of turbulence zones on or in the component.

3. The system as claimed in claim 1, wherein said actuators and said sensors are arranged in an region of the greatest expected deformation.

4. The system as claimed in claim 3, wherein said sensors and the actuators are arranged in the region of channel direction changes.

5. The system as claimed in claim 1, wherein all of said piezoelectric elements act as sensors in the quiescent state or when the oscillation excitation is low, and selected elements are activated as actuators as a function of oscillation excitation.

6. The system as claimed inn claim 1, wherein an adaptronic control loop is provided.

7. A projection exposure objective for semiconductor lithography with a system for damping oscillations in cooling channels of an optical element with the following steps:
    a) oscillations that occur being detected by sensors,
    b) after the detection the results are supplied in the form of a control loop to actuators,
    c) the actuators are piezoelectric elements in the form of thin plates, films or layers,
    d) by activation of said actuators oscillations are produced, which are in antiphase to the oscillations produced by turbulence in the fluid, and whose frequency and amplitude are at least approximately the same, and
    wherein the oscillations that are detected by the sensors originate from a cooling channel of an optical element.

8. The system as claimed in claim 7, wherein said actuators and said sensors are arranged in an region of turbulence zones on or in the cooling channel of the projection exposure objective.

9. The system as claimed in claim 7, wherein said actuators and said sensors are arranged in an region of the greatest expected deformation.

10. The system as claimed in claim 7, wherein said sensors are piezoelectric elements.

11. The system as claimed in claim 7, wherein the oscillations that are detected by the sensors originate from a projection exposure objective for semiconductor lithography.

12. An optical element with a system for damping oscillations in cooling channels of the optical element with the following steps:
    a) oscillations that occur being detected by sensors,
    b) after the detection the results are supplied in the form of a control loop to actuators,
    c) the actuators are piezoelectric elements in the form of thin plates, films or layers,
    d) by activation of said actuators oscillations are produced, which are in antiphase to the oscillations produced by turbulence in the fluid, and whose frequency and amplitude are at least approximately the same, and
    wherein said sensors and the actuators are arranged in an region of channel direction changes.

13. The optical element as claimed in claim 12, wherein said sensors are piezoelectric elements.

14. The optical element as claimed in claim 12, wherein the oscillations that are detected by the sensors originate from a cooling channel of the optical element.

15. The optical element as claimed in claim 13, wherein said piezoelectric elements comprise the only structure of the actuators.

16. A system for damping oscillations in cooling channels of an optical element through which fluid flows in a component with the following steps:
    a) oscillations that occur being detected by sensors,
    b) after the detection the results are supplied in the form of a control loop to actuators,
    c) the actuators are piezoelectric elements in the form of thin plates, films or layers,
    d) by activation of said actuators oscillations are produced, which are in antiphase to the oscillations produced by turbulence in the fluid, and whose frequency and amplitude are at least approximately the same, and
    wherein actuators and sensors are arranged in the region of the greatest expected deformation, and wherein said sensors and the actuators are arranged in the region of channel direction changes.

17. A system for damping oscillations in cooling channels of an optical element through which fluid flows in a component with the following steps:
    a) oscillations that occur being detected by sensors,
    b) after the detection the results are supplied in the form of a control loop to actuators,
    c) the actuators are piezoelectric elements in the form of thin plates, films or layers,
    d) by activation of said actuators oscillations are produced, which are in antiphase to the oscillations produced by turbulence in the fluid, and whose frequency and amplitude are at least approximately the same, and wherein said sensors are piezoelectric elements, and wherein said piezoelectric elements are arranged alternately as sensors and as actuators in the component.

18. A system for damping oscillations in cooling channels of an optical element through which fluid flows in a component with the following steps:

a) oscillations that occur being detected by sensors, b) after the detection the results are supplied in the form of a control loop to actuators, c) the actuators are piezoelectric elements in the form of thin plates, films or layers, d) by activation of said actuators oscillations are produced, which are in antiphase to the oscillations produced by turbulence in the fluid, and whose frequency and amplitude are at least approximately the same, and wherein said sensors are piezoelectric elements, and wherein all of said piezoelectric elements act as sensors in the quiescent state or when the oscillation excitation is low, and selected elements are activated as actuators as a function of oscillation excitation.

19. A system for damping oscillations in a structure, comprising:

a sensor provided in sensing relation with a structure to detect first oscillations from the structure;

an actuator comprising a piezoelectric element secured to and directly contacting the structure;

a control loop coupled between the sensor and the actuator, the control loop is configured to provide data from the sensor comprising at least phase, frequency and amplitude of the first oscillations and send the data to the actuator;

in response to the data, the actuators are configured to activate to produce second oscillations which are opposite in phase to the first oscillations and which have substantially the same frequency and amplitude of the first oscillations; and wherein the first oscillations originate from flowing fluid through a cooling channel.

20. The system of claim 19 wherein the piezoelectric element comprises a thin plate, film or layer.

21. The system of claim 19 wherein the sensor and actuator are positioned on the structure proximate regions of greatest deformation.

22. The system of claim 19 wherein the actuator comprises no intermediate structure between the piezoelectric element and the structure with the first oscillations.

23. The system of claim 19 wherein the structure comprises channels for receiving fluid.

24. The system of claim 19 wherein the structure is tubular for receiving flowing fluid.

25. The system of claim 19 wherein the structure comprises cooling channels for an optical element.

26. The system of claim 19 wherein the structure comprises cooling channels for a projection exposure objective configured for use in semiconductor lithography.

27. The system of claim 19 wherein the sensor comprises a piezoelectric element.

28. The system of claim 19 wherein the sensor comprises a piezoelectric element formed as a thin plate, film or layer.

29. A system for damping oscillations in cooling channels of an optical element through which fluid flows in a component with the following steps:

a) oscillations that occur being detected by sensors, b) after the detection the results are supplied in the form of a control loop to actuators, c) the actuators are piezoelectric elements in the form of thin plates, films or layers, d) by activation of said actuators oscillations are produced, which are in antiphase to the oscillations produced by turbulence in the fluid, and whose frequency and amplitude are at least approximately the same, wherein said actuators and said sensors are arranged in an region of the greatest expected deformation, and wherein said sensors and the actuators are arranged in the region of channel direction changes.

30. A system for damping oscillations in cooling channels of an optical element through which fluid flows in a component with the following steps:

a) oscillations that occur being detected by sensors, b) after the detection the results are supplied in the form of a control loop to actuators, c) the actuators are piezoelectric elements in the form of thin plates, films or layers, d) by activation of said actuators oscillations are produced, which are in antiphase to the oscillations produced by turbulence in the fluid, and whose frequency and amplitude are at least approximately the same, wherein said sensors are piezoelectric element, and wherein all of said piezoelectric elements act as sensors in the quiescent state or when the oscillation excitation is low, and selected elements are activated as actuators as a function of oscillation excitation.

31. An optical element with a system for damping oscillations in cooling channels of the optical element with the following steps:

a) oscillations that occur being detected by sensors, b) after the detection the results are supplied in the form of a control loop to actuators, c) the actuators are piezoelectric elements in the form of thin plates, films or layers, d) by activation of said actuators oscillations are produced, which are in antiphase to the oscillations produced by turbulence in the fluid, and whose frequency and amplitude are at least approximately the same, and wherein the oscillations that are detected by the sensors originate from a cooling channel of the optical element.

* * * * *